(12) United States Patent
Robinson

(10) Patent No.: US 9,089,044 B1
(45) Date of Patent: Jul. 21, 2015

(54) EMI SHIELDING CONNECTOR GASKET

(71) Applicant: Laird Technologies, Inc., Earth City, MO (US)

(72) Inventor: Kenneth M. Robinson, Effort, PA (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 14/245,290

(22) Filed: Apr. 4, 2014

(51) Int. Cl.
- H05K 9/00 (2006.01)
- H01B 1/12 (2006.01)
- H05K 13/00 (2006.01)

(52) U.S. Cl.
CPC .............. *H05K 9/0015* (2013.01); *H01B 1/124* (2013.01); *H05K 9/0009* (2013.01); *H05K 13/00* (2013.01)

(58) Field of Classification Search
CPC .......................... H05K 9/0015; H05K 9/0009
See application file for complete search history.

(56) References Cited

U.S. PATENT DOCUMENTS

| | | | |
|---|---|---|---|
| 5,045,635 A | 9/1991 | Kaplo et al. | |
| 5,142,101 A * | 8/1992 | Matsuzaki et al. | 174/354 |
| 6,075,205 A | 6/2000 | Zhang | |
| 6,204,444 B1 * | 3/2001 | Pugliese et al. | 174/358 |
| 6,355,878 B1 * | 3/2002 | Kim | 174/355 |
| 6,613,976 B1 * | 9/2003 | Benn, Jr. | 174/358 |
| 7,612,299 B2 * | 11/2009 | Chen | 174/359 |
| 8,058,569 B2 | 11/2011 | Kline | |
| 2004/0261322 A1 | 12/2004 | Baratin et al. | |
| 2006/0279937 A1 * | 12/2006 | Manson et al. | 361/724 |
| 2009/0000818 A1 * | 1/2009 | Poulsen | 174/370 |
| 2011/0226521 A1 * | 9/2011 | Wertz et al. | 174/366 |
| 2014/0360772 A1 * | 12/2014 | Coppola et al. | 174/390 |

FOREIGN PATENT DOCUMENTS

| | | |
|---|---|---|
| GB | 835484 | 5/1960 |
| GB | 852214 | 10/1960 |

OTHER PUBLICATIONS

Parker Chomerics, Extruded EMI Gaskets, Products and Custom Solutions Catalog, Sep. 2008; 84 pgs.
Laird Technologies, Elastomeric EMI Shileding Solutions; 2006; 56 pgs.

* cited by examiner

*Primary Examiner* — Hung V Ngo
(74) *Attorney, Agent, or Firm* — Harness, Dickey & Pierce, P.L.C.

(57) ABSTRACT

A molded connector gasket of indefinite length or circumference that provides electromagnetic interference shielding of electronic components is disclosed. The disclosed gasket may have a cross-sectional profile comprising three protruding members including a first member being generally vertical, a second member being generally forty-five degrees from the first member via a curve, and a third member protruding from the second member near the curve, the third member being at an angle generally less than vertical but more than forty five degrees with respect to the second member.

20 Claims, 5 Drawing Sheets

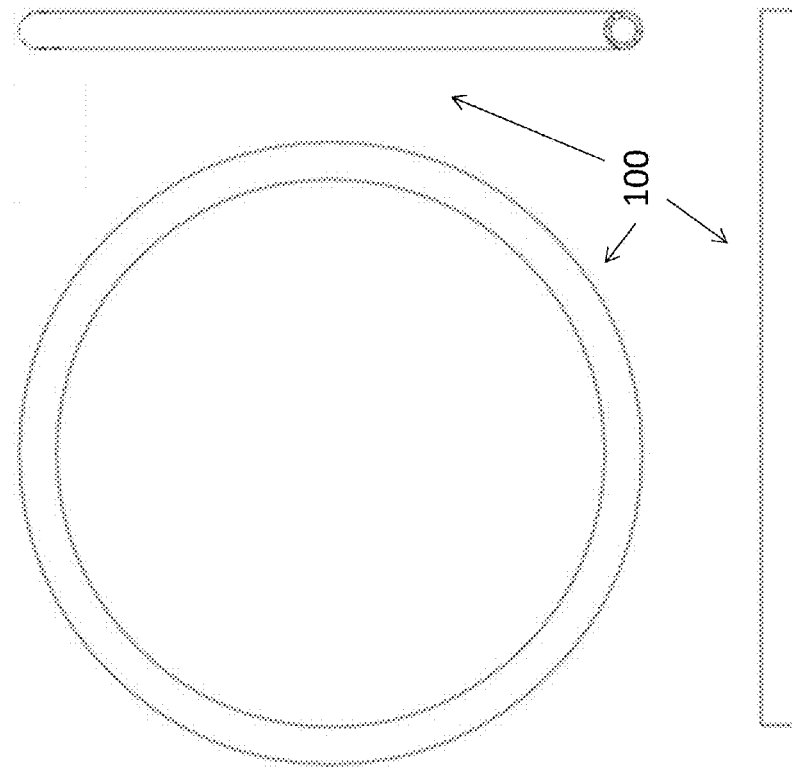

EMI SHIELDING CONNECTOR GASKET

FIELD OF THE DISCLOSURE

This application includes disclosures of embodiments of molded connector gaskets of indefinite length or circumference that provide electromagnetic interference shielding of electronic components.

BACKGROUND

The statements in this section merely provide background information related to this disclosure and do not necessarily constitute prior art.

Electrically conductive elastomers (ECEs) may be made into electromagnetic interference (EMI) blocking or mitigating gaskets of indeterminate length or circumference. Many such gaskets may have a round cross-sectional profile. Compression forces imposed upon these round profile gaskets when in use may result in imperfect performance such that the compression of the gasket may be non-uniform through the length of the gasket. Additionally, when these round profile gaskets are manufactured into a continuous circumference, the gasket is first extruded and then fused at opposing ends to create a continuous looped gasket, leading to a more costly and error-prone product. Finally, these round profile gaskets have sub-optimal performance around ninety degree corners, leading to possible penetration of electromagnetic interference and an incongruent seal.

Round profile EMI gaskets 100 of the prior art, as seen in FIGS. 1A, 1B, 1C, 2A, and 2B, have several disadvantages. Due to their shape, compression forces placed on the gasket when installed on a metal EMI cage 102 result in inconsistent compression and deflection, as well as undesirable forces required to compress the gasket into a suitable EMI shield. When a non-watertight seal is required, additional compression forces needed to compress the gasket and complete the EMI seal are undesirable. It should be noted that the particular example of a metal EMI cage 102 as seen in FIG. 2B is not necessarily prior art.

A round profile gasket 100 as shown in FIGS. 1A-1C, when installed on a metal EMI cage 102 as seen in FIG. 2B, may compress as seen in FIG. 2A. A round gasket with a diameter of 2.62 millimeters (mm), for example, when installed in an opening of 2.62 mm×2.30 mm, has an actual installed height of 2.84 mm. When compressed to a height of 1.82 mm, in this example, the gasket required a force of 0.62 Newtons per millimeter (N/mm). But due to the compression forces when installed, the round face gasket would bulge out beyond the tabs 104 of the metal EMI cage in FIG. 2B, creating additional forces on the gasket and cage. These forces, determined by finite element analysis, included a deformation force of 4.4 N over a 7.125 mm segment near the bulge around the tabs.

SUMMARY OF THE DISCLOSURE

This section provides a general summary of the disclosure, and is not a comprehensive disclosure of its full scope or all of its features.

A new electromagnetic interference gasket is disclosed, where the gasket has a generally lambda-shaped cross-sectional profile in that the profile comprises a generally vertical downward first protrusion, that first protrusion curving into a second protrusion at a generally forty-five degree angle, and a third protrusion that spurs off of the second protrusion near the curve between the first and second protrusions at between approximately ninety degrees relative to the second protrusion and vertical. The gasket may be said to resemble a lower case lambda shape.

The gasket may be of an indeterminate length or, where it is in a continuous loop, of an indeterminate outline and/or circumference. The EMI gasket may be made of an electrically-conductive elastomer via any number of methods, including a two-piece mold.

Further areas of applicability will become apparent from the description provided herein. The description and specific examples in this summary are intended for purposes of illustration only and are not intended to limit the scope of the present disclosure.

DESCRIPTION OF THE DRAWINGS

The drawings described herein are for illustrative purposes only of selected embodiments and not all possible implementations, and are not intended to limit the scope of the present disclosure.

FIG. 1, which constitutes prior art, shows three different views of the round profile gasket of the prior art. FIG. 1A shows a cross-sectional profile view, FIG. 1B shows a side view of a length of gasket, and FIG. 1C shows a perspective view of a segment of the gasket.

Corresponding reference numerals indicate corresponding parts throughout the several views of the drawings

DETAILED DESCRIPTION OF THE DISCLOSURE

Example embodiments will now be described more fully with reference to the accompanying drawings.

Figure 3:
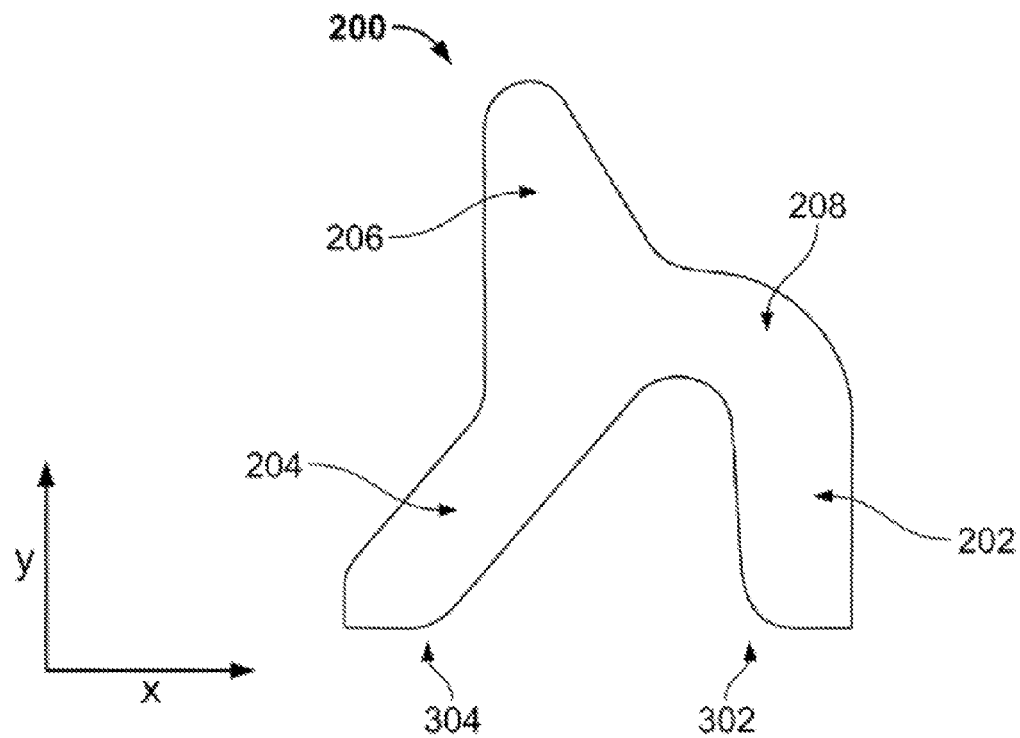
FIG. 3 shows a cross-sectional view of an embodiment of the disclosed EMI shielding gasket.

An EMI shielding ECE gasket is disclosed, an embodiment of which is seen in the figures, beginning in FIG. 3. The cross-sectional profile of the gasket 200 in FIG. 3 has three distinct protrusions or protruding members 202, 204, and 206. In an embodiment, when in an uncompressed (at rest) state, the profile comprises a generally vertical downward first protrusion or protruding member 202, that protrusion curving into a second protrusion or protruding member 204 at a generally forty-five degree angle, and a third protrusion or protruding member 206 that spurs off of the second protrusion near the curve 208 between the first and second protrusions at between approximately ninety degrees relative to the second protrusion and vertical. Each of these protrusions may be of similar length and thickness. The gasket may be said to resemble a lower case lambda shape.

Thus, the disclosed gasket 200 includes a body of indefinite length, the gasket having a cross-sectional profile comprising three protruding members 202, 204, and 206, the first member 202 being generally vertical, the second member 204 being generally forty-five degrees from the first member via a curve 208, and a third member 206 protruding from the second member near the curve, the third member being at an angle generally less than vertical but more than forty five degrees with respect to the second member.

In the profile view of FIG. 3, the first member 202 may have a first free end 302, just as the second member 204 may have a second free end 304. An imaginary triangle consisting of the first member 202, the second member 204, and a line generally defined by endpoints of the first free end 302 and the second free end 304, may be a right triangle, as is the case of the embodiment in FIG. 3, where the ninety degree angle of the right triangle is defined by the first member 202 and the line generally defined by endpoints of the first free end 302 and the second free end 304, and the triangle's hypotenuse is defined by the second member 204.

Figure 4:
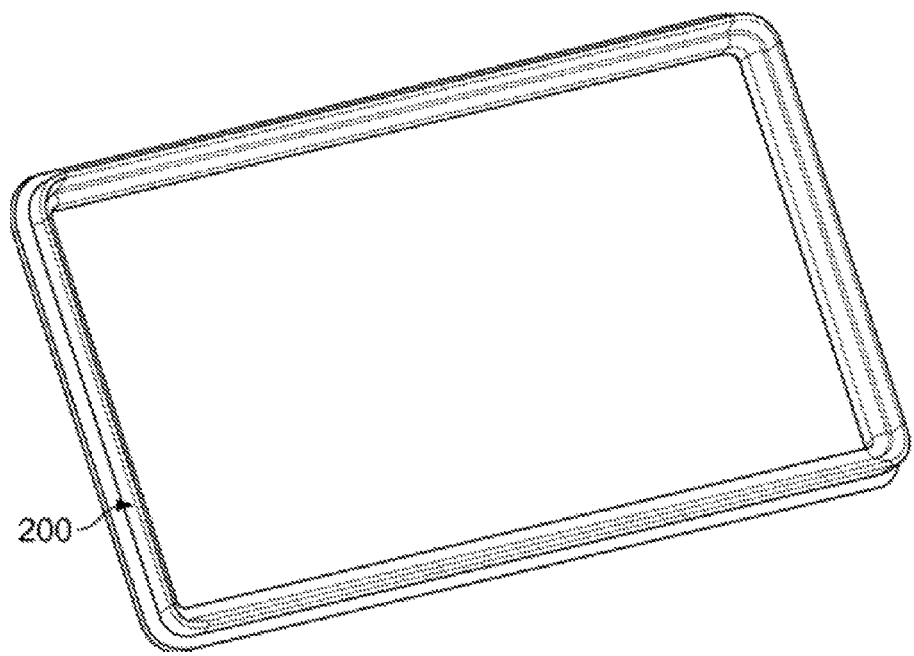
FIG. 4 shows a perspective view of a generally rectangular circumference of the disclosed EMI shielding gasket.
Figure 5:
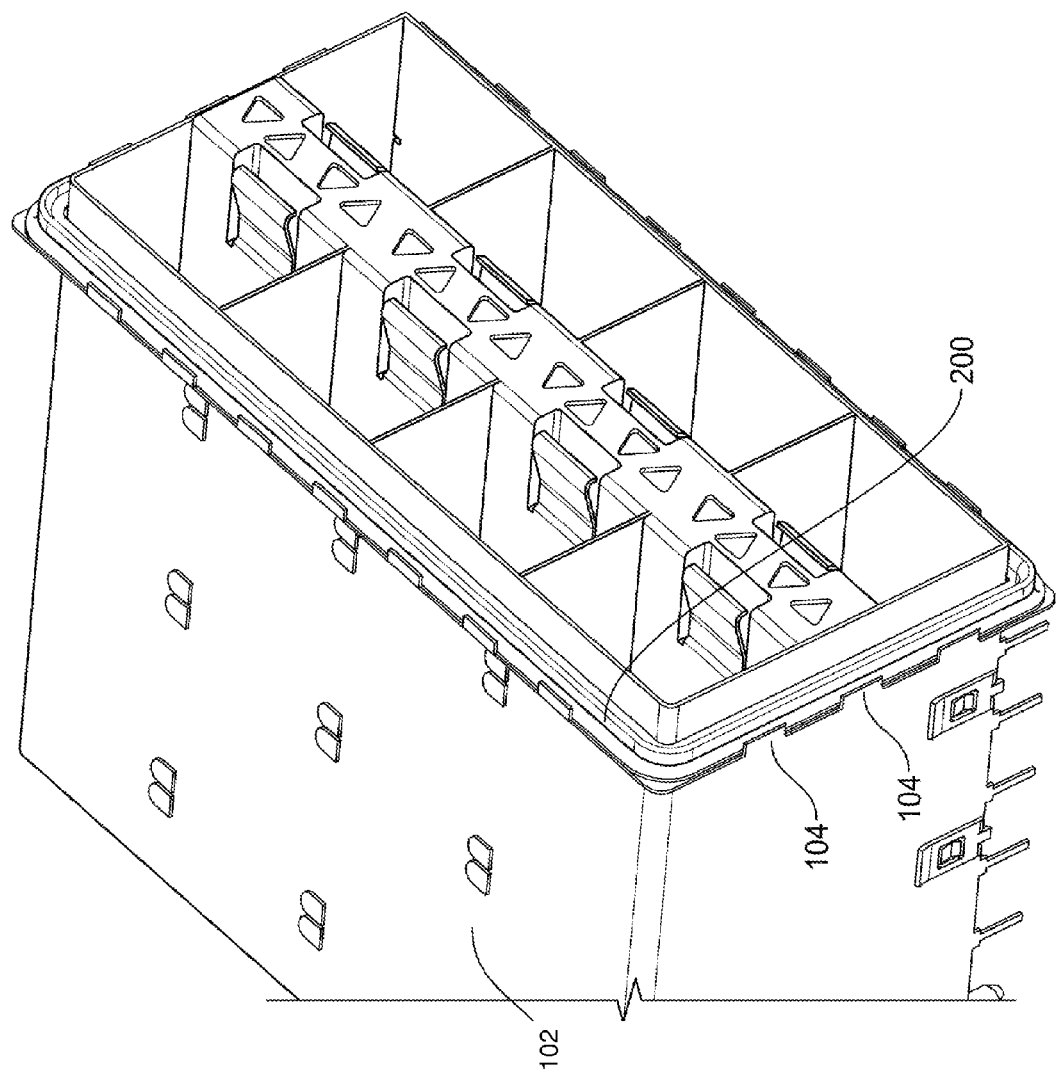
FIG. 5 shows a perspective view of the gasket of FIG. 4 installed on a metal EMI cage.
Figure 7:
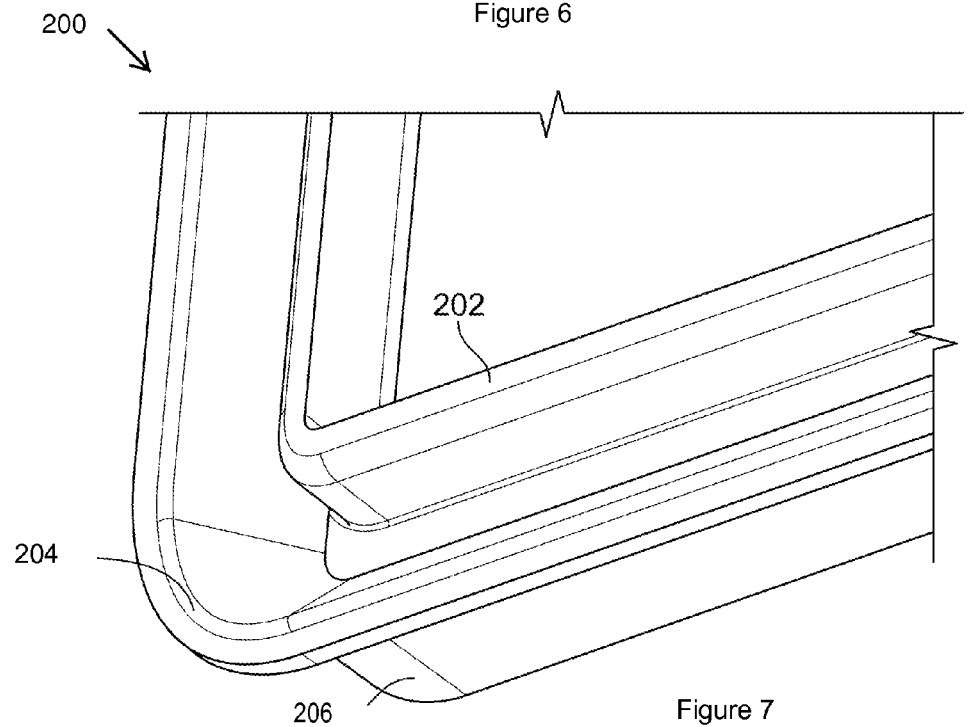
FIG. 7 shows a close up perspective view of a rounded corner of the disclosed EMI shielding gasket seen in FIG. 4.

As can be seen in FIG. 4, which shows a molded version of the disclosed gasket 200 in a generally rectangular shape, the rounded corners of the gasket are not bent and pinched as would be the case in an extruded round profile gasket. This is further illustrated in FIG. 7, which shows a close up of a corner of the gasket in FIG. 4. When installed around a metal EMI cage 102 (a perspective view of which can be seen in FIG. 5), the gasket's molded shape permits the non-deforming compression of the gasket at all angles. FIGS. 4 and 5 aim to show the improvements of the disclosed gasket over the extruded gasket of FIGS. 1A, 1B, 1C, 2A, and 2B when the application requires the gasket continue about a corner of, for example, ninety degrees.

Though a rounded rectangle shape is shown in FIG. 4, this embodiment is not exclusive. Square or other polygonal shapes are embraced by this disclosure, as well as circular, oval, or any number of shapes that might include arcing elements. In addition to a molded contiguous shape, the present disclosure includes a linear section of gasket having a profile similar to that in FIG. 3 of any length.

Figure 6:
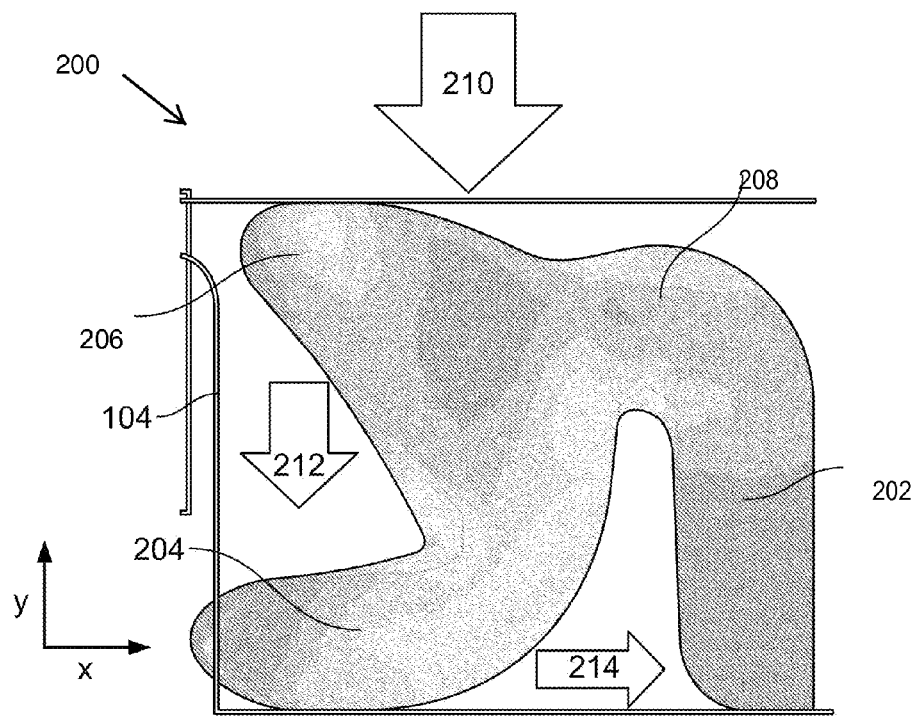
FIG. 6 shows a cross-sectional view of the disclosed EMI gasket when compressed in use on the metal EMI cage as seen in FIG. 5.

An embodiment of the compression of the disclosed gasket is seen in FIG. 6. As a compression force 210 is applied downwardly on the gasket 200, the third protrusion 206 moves in a first direction 212 similar to that of the compression force, while the second protrusion 204 slides in a second direction 214 towards the first protrusion 202 about a pivot point generally defined by the curve 208 between the first and second protrusions. Thus, the compression of the gasket 200 results in an internal compression that does not exceed the outer radius of the relaxed uncompressed gasket.

Figure 2A:
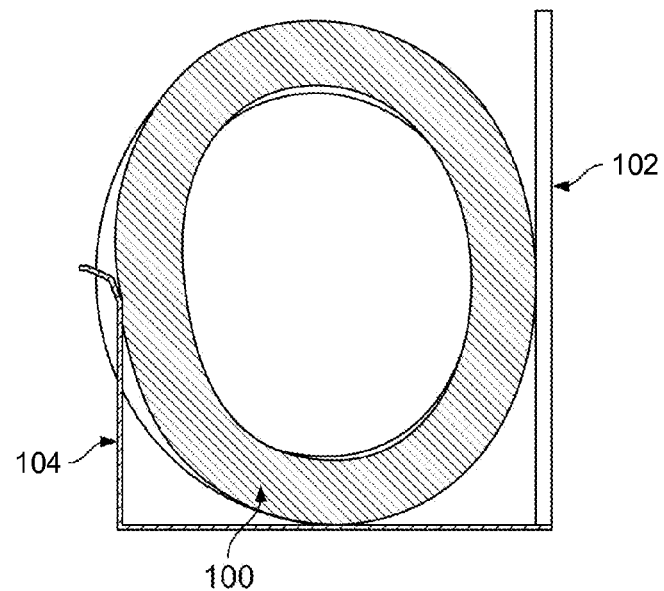
FIG. 2A, which constitutes prior art, shows a cross-sectional view of a compressed round profile gasket when installed on a metal EMI cage, as perspective view of which can be seen in FIG. 2B.
Figure 2B:
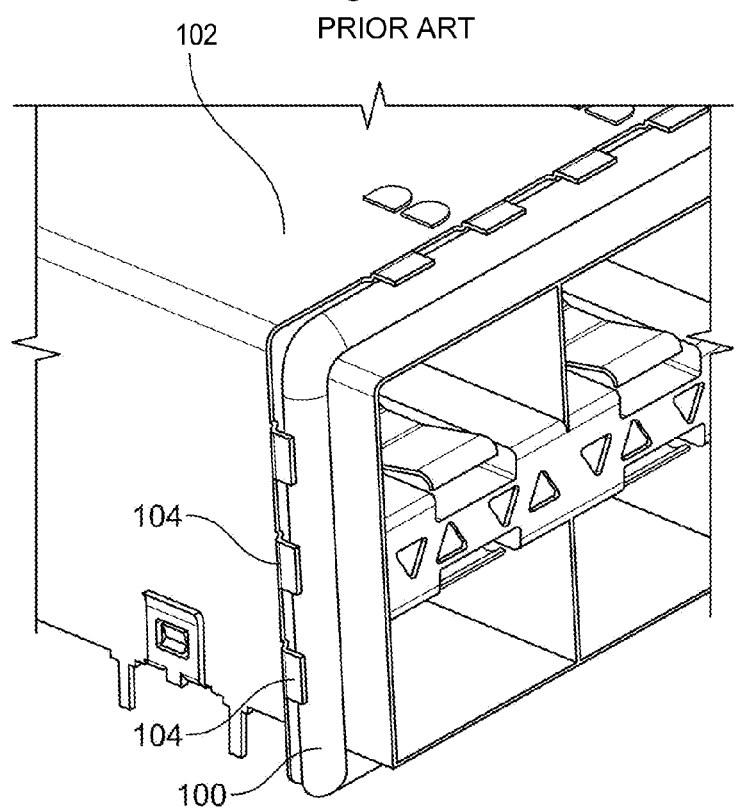

The compression mechanism as seen in FIG. 6 overcomes the bulging around the tabs 104 that comes from the compression of a prior art round profile gasket 100 as seen in FIG. 2B. The amounts of force felt by the gasket 200 during compression can be seen in FIG. 6, where darker gray regions represent less force against the gasket and lighter regions show generally more force.

Where the gasket of FIG. 3 has a total height, for example, of 2.6 mm, the compression in FIG. 6, a test gasket required an installation force of about 0.3 N/mm, which is less than half of the baseline compression force for a similarly-sized round profile gasket (that being 0.62 N/mm, as discussed previously herein).

The gasket may be constructed of any suitable electroseal elastomer, including, but not limited to, ethylene propylene diene monomer (EPDM), silicone, fluorosilicone, or any combination thereof. The electroseal elastomer may have one or more fillers added to it, including, but not limited to, nickel, graphite, silver, copper, aluminum, glass, carbon, or any combination thereof. In an embodiment, the electrically conductive elastomer may be a blend of silicone and nickel plated graphite. The gasket may be made by any suitable method, including extrusion, injection molding, or compression molding. The gasket may be of an indeterminate length or, where it is in a continuous loop, of an indeterminate outline and/or circumference.

Though the term "vertical" is used herein, it would be understood by those of skill in the art that the disclosed gasket may be used in any orientation and vertical is not intended to be limiting. FIGS. 3 and 6, for example, include an x/y axis for reference when the vertical nature of any element of the gasket is discussed. These orientations are merely intended to provide a spatial reference so that the relation of the three protrusions relative to one another may be described.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention as well as all equivalents thereof.

What is claimed is:

1. A gasket comprising a body of indefinite length, the gasket having a cross-sectional profile comprising three protruding members including a first member being generally vertical, a second member being generally forty-five degrees from the first member via a curve, and a third member protruding from the second member near the curve, the third member being at an angle generally less than vertical but more than forty five degrees with respect to the second member.

2. The gasket of claim 1, wherein the gasket is comprised of an electrically conductive elastomer.

3. The gasket of claim 2, wherein the electrically conductive elastomer is an electroseal elastomer selected from the group consisting of ethylene propylene diene monomer, silicone, fluorosilicone, or any combination thereof.

4. The gasket of claim 3, wherein the electroseal elastomer further comprises one or more fillers selected from the group consisting of nickel, graphite, silver, copper, aluminum, glass, carbon, or any combination thereof.

5. The gasket of claim 1, wherein the gasket comprises an electrically conductive elastomer, the electrically conductive elastomer being a blend of silicone and nickel plated graphite.

6. The gasket of claim 1, wherein the gasket has been molded into a continuous loop.

7. The gasket of claim 6, wherein the continuous loop is a rectangle with generally rounded edges.

8. The gasket of claim 7, wherein the gasket comprises an electrically conductive elastomer, the electrically conductive elastomer being a blend of silicone and nickel plated graphite.

9. The gasket of claim 1, further comprising a first free end generally at the end of the first member, and a second free end generally at the end of the second member, wherein a triangle having three sides consisting of the first member, the second member, and a line defined by the first free end and the second free end is a right triangle, where the ninety degree angle of the right triangle is defined by the first member and the line defined by the first free end and the second free end, and the hypotenuse of the right triangle is defined by the second member.

10. The gasket of claim 9, wherein the gasket is comprised of an electrically conductive elastomer.

11. The gasket of claim 10, wherein the electrically conductive elastomer is an electroseal elastomer selected from the group consisting of ethylene propylene diene monomer, silicone, fluorosilicone, or any combination thereof.

12. The gasket of claim 11, wherein the electroseal elastomer further comprises one or more fillers selected from the group consisting of nickel, graphite, silver, copper, aluminum, glass, carbon, or any combination thereof.

13. The gasket of claim 10, wherein the electrically conductive elastomer being a blend of silicone and nickel plated graphite.

14. The gasket of claim 10, wherein the gasket has been molded into a continuous rectangle with generally rounded edges.

15. The gasket of claim 14, wherein the electrically conductive elastomer being a blend of silicone and nickel plated graphite, and wherein the cross-sectional profile of the gasket is a lower case lambda shape.

16. An EMI shielding connector gasket comprising a body of indefinite length, the gasket having a cross-sectional profile comprising three protruding members including a first member being generally vertical, a second member being generally forty-five degrees from the first member via a curve when the gasket is in an uncompressed state, and a third member protruding from the second member near the curve, the third member being at an angle generally less than vertical but more than forty five degrees with respect to the second member when the gasket is in an uncompressed state.

17. The EMI shielding connector gasket of claim 16, wherein, upon compression in a first direction generally in line with the generally vertical first member, the second member rotates about a pivot point generally defined by the curve, such that the angle between the first member and the second member reduces from the angle between the first member and the second member when the gasket is in an uncompressed state.

18. A method of providing electromagnetic interference shielding comprising providing a gasket comprising a body of indefinite length, the gasket having a cross-sectional profile comprising three protruding members including a first member being generally vertical, a second member being generally forty-five degrees from the first member via a curve, and a third member protruding from the second member near the curve, the third member being at an angle generally less than vertical but more than forty five degrees with respect to the second member, and installing the gasket on a metal EMI cage.

19. The method of claim 18, further comprising compressing the gasket in a first direction generally in line with the generally vertical first member, such that the second member rotates about a pivot point generally defined by the curve, such that the angle between the first member and the second member reduces from the angle between the first member and the second member when the gasket is in an uncompressed state.

20. The method of claim 18, wherein the gasket comprises an electrically conductive elastomer, the electrically conductive elastomer being a blend of silicone and nickel plated graphite.

* * * * *